US011058007B2

(12) United States Patent
Gavagnin et al.

(10) Patent No.: US 11,058,007 B2
(45) Date of Patent: Jul. 6, 2021

(54) COMPONENT CARRIER WITH TWO COMPONENT CARRIER PORTIONS AND A COMPONENT BEING EMBEDDED IN A BLIND OPENING OF ONE OF THE COMPONENT CARRIER PORTIONS

(71) Applicant: AT&S Austria Technologie & Systemtechnik Aktiengesellschaft, Leoben (AT)

(72) Inventors: Marco Gavagnin, Leoben (AT); Markus Leitgeb, Trofaiach (AT); Alexander Kasper, Graz (AT); Gernot Schulz, Graz (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/182,455

(22) Filed: Nov. 6, 2018

(65) Prior Publication Data
US 2019/0141836 A1 May 9, 2019

(30) Foreign Application Priority Data
Nov. 6, 2017 (EP) .................................... 17200200

(51) Int. Cl.
*H05K 1/18* (2006.01)
*H01L 21/48* (2006.01)
(Continued)

(52) U.S. Cl.
CPC ......... *H05K 1/188* (2013.01); *H01L 21/4857* (2013.01); *H01L 23/5387* (2013.01);
(Continued)

(58) Field of Classification Search
CPC . H05K 1/188; H05K 1/02; H05K 1/11; H05K 1/14; H05K 1/16; H05K 1/18;
(Continued)

(56) References Cited

U.S. PATENT DOCUMENTS 6,469,377 B1 * 10/2002 Kondo ................ H01L 23/5382
257/686
7,129,117 B2 * 10/2006 Hsu ......................... H01L 21/56
438/112
(Continued)

FOREIGN PATENT DOCUMENTS

WO    WO 2015/006393 A1    1/2015

OTHER PUBLICATIONS

First Office Action in Application No. 201811308900.7; pp. 1-7; Feb. 5, 2021; China National Intellectual Property Administration, No. 6, Xitucheng Lu, Jimenqiao Haidian District, Beijing City, 100088, China.
(Continued)

*Primary Examiner* — Tuan T Dinh
(74) *Attorney, Agent, or Firm* — Robert A. Blaha; Smith Tempel Blaha LLC

(57) ABSTRACT

A component carrier with a) a first component carrier portion having a blind opening; b) a component arranged in the blind opening; and c) a second component carrier portion at least partially filling the blind opening. At least one of the first component carrier portion and the second component carrier portion includes a flexible component carrier material, and the first component carrier portion and the second component carrier portion form a stack of a plurality of electrically insulating layer structures and/or electrically conductive layer structures. It is further described a method for manufacturing such a component carrier.

13 Claims, 7 Drawing Sheets

(51) Int. Cl.
  *H01L 23/538* (2006.01)
  *H05K 1/02* (2006.01)
  *H05K 3/46* (2006.01)

(52) U.S. Cl.
  CPC ......... *H01L 23/5389* (2013.01); *H05K 1/028* (2013.01); *H05K 3/4664* (2013.01); *H05K 3/4697* (2013.01); *H01L 2224/18* (2013.01); *H05K 1/185* (2013.01); *H05K 3/4602* (2013.01); *H05K 2201/0141* (2013.01); *H05K 2201/0154* (2013.01); *H05K 2203/063* (2013.01); *H05K 2203/1469* (2013.01); *H05K 2203/1476* (2013.01)

(58) Field of Classification Search
  CPC ........... H05K 1/141–144; H05K 1/165; H05K 1/181–187; H01L 21/4857; H01L 23/5387
  USPC ................ 361/749, 750, 764–766, 792–795; 174/254–260; 257/720–730, 787–790
  See application file for complete search history.

(56) References Cited

U.S. PATENT DOCUMENTS

| | | | | |
|---|---|---|---|---|
| 7,545,649 | B2* | 6/2009 | Tan | H05K 1/028 |
| | | | | 174/254 |
| 7,583,512 | B2* | 9/2009 | Ryu | H05K 1/185 |
| | | | | 361/765 |
| 7,742,314 | B2* | 6/2010 | Urashima | H01L 21/568 |
| | | | | 361/793 |
| 7,839,649 | B2* | 11/2010 | Hsu | H01L 23/5389 |
| | | | | 361/761 |
| 8,879,276 | B2* | 11/2014 | Wang | H05K 1/165 |
| | | | | 361/761 |
| 8,941,230 | B2* | 1/2015 | Kyozuka | H01L 24/24 |
| | | | | 257/698 |
| 2007/0187842 | A1 | 8/2007 | Shin et al. | |
| 2009/0294027 | A1* | 12/2009 | Wang | H01L 25/0657 |
| | | | | 156/150 |
| 2010/0075464 | A1 | 3/2010 | Chew et al. | |
| 2011/0199739 | A1* | 8/2011 | Naganuma | H05K 3/4691 |
| | | | | 361/749 |
| 2012/0091594 | A1* | 4/2012 | Landesberger | H01L 23/3121 |
| | | | | 257/774 |
| 2012/0211895 | A1 | 8/2012 | Lange et al. | |
| 2013/0284506 | A1* | 10/2013 | Zanma | H05K 1/185 |
| | | | | 174/260 |
| 2014/0072701 | A1 | 3/2014 | Song | |
| 2014/0233166 | A1* | 8/2014 | O'Shea | H05K 1/189 |
| | | | | 361/679.02 |
| 2014/0268594 | A1 | 9/2014 | Wang et al. | |
| 2015/0327369 | A1* | 11/2015 | Seki | H05K 1/188 |
| | | | | 361/761 |
| 2016/0165732 | A1* | 6/2016 | Moon | H05K 1/185 |
| | | | | 361/762 |
| 2017/0064835 | A1* | 3/2017 | Ishihara | H05K 3/4697 |

OTHER PUBLICATIONS

Degroote, Bart; Communication Pursuant to Article 94(3) EPC in Application No. 17 200 200.8; pp. 1-5; dated Feb. 1, 2021; European Patent Office, Postbus 5818, 2280 HV Rijswijk, Netherlands.

First Office Action in Application No. 201811308900.7 (Translated); pp. 1-3; dated Feb. 5, 2021; China National Intellectual Property Administration, No. 6, Xitucheng Lu, Jimenqiao Haidian District, Beijing City, 100088, China.

* cited by examiner ns and a
COMPONENT CARRIER WITH TWO COMPONENT CARRIER PORTIONS AND A COMPONENT BEING EMBEDDED IN A BLIND OPENING OF ONE OF THE COMPONENT CARRIER PORTIONS

TECHNICAL FIELD

The present invention relates to the technical field of component carriers. Further, the present invention relates to a method for manufacturing such a component carrier.

TECHNOLOGICAL BACKGROUND

In modern electronic manufacturing it is becoming more and more important to embed or integrate electronic components within a component carrier onto which later an electronic assembly with several electrically interconnected components is built up. For instance, if the embedded electronic component is an RFID component, a traceability of the individual component carrier can be realized through a variety of process steps, in particular process steps for building up electronic circuits onto the component carrier. Such process steps may include solder paste printing, mounting electronic components onto the component carrier e.g. by means of a so called pick and place process, and heating up the assembled component carrier in an oven in order to solder the terminals of the mounted electronic components at respective conductor pads being provided at the top surface of the component carrier. Traceability might also be relevant in particular for safety relevant electronic products, e.g. airbag controllers, because it allows to identify a defective electronic product in a unique manner. In case a defect product shows up a specific product recall can be initiated which includes all products which have been manufactured at the same time, with the same feedstock, and/or under similar or the same production conditions.

Embedding electronic components can cause problems not only during manufacturing of component carriers with embedded electronic components but also during an operation of an electronic product comprising a component carrier with an embedded electronic component. This is often caused by thermal stress resulting from different thermal expansion coefficients (i) of semiconductor material, e.g. silicon, (ii) of adhesive material used for attaching an embedded component in a cavity or opening of the component carrier, and (iii) of a component carrier material, e.g. FR4 being frequently used for printed circuit boards (PCB). Therefore, it is a generally accepted approach to embed an electronic component in a component carrier environment which is mechanically stable not only during manufacturing but also during operation.

However, many applications require flexible component carriers. In this respect it should be clear that embedding electronic components within flexible component carriers requires a completely new approach because flexible component carriers cannot provide to the same extend for a mechanically stable environment. As a consequence, reliability of operation might be deteriorated.

SUMMARY

There may be a need for providing a method for manufacturing an at least partially flexible component carrier with an embedded component, which component carrier exhibits a high operational reliability.

This need may be met by the subject matter according to the independent claims. Advantageous embodiments of the present invention are described by the dependent claims.

According to an example embodiment there is provided a component carrier with (a) a first component carrier portion having a blind opening; (b) a component arranged in the blind opening; and (c) a second component carrier portion at least partially filling the blind opening. At least one of the first component carrier portion and the second component carrier portion comprises a flexible component carrier material. Further, the first component carrier portion and the second component carrier portion form a stack of a plurality of electrically insulating layer structures and/or electrically conductive layer structures.

The described component carrier is based on the idea that embedding the component within a stack of several layer structures allows for the realization of an at least partially flexible component carrier with an embedded component. Thereby, the component carrier may be a pure flexible component carrier or a so called rigid-flexible or semi flexible component carrier having at least one rigid component carrier region and at least one flexible component carrier region. In preferred rigid-flexible component carriers along a main plane (i.e. perpendicular to planes of the layer structures) two rigid component carrier regions are connected with each other via a flexible component carrier region.

OVERVIEW OF EMBODIMENTS

In the context of this document, the term "component carrier" may particularly denote any support structure which is capable of accommodating one or more components thereon and/or therein (in addition to the already mentioned embedded component) for providing mechanical support and/or electrical connectivity. In other words, a component carrier may be configured as a mechanical and/or electronic carrier for components. In particular, a component carrier may be one of a printed circuit board (PCB), an organic interposer, and an IC (integrated circuit) substrate. A component carrier may also be a hybrid board combining different ones of the above mentioned types of component carriers.

The component carrier and/or at least one of the component carrier portions may comprise a stack of at least one electrically insulating layer structure and at least one electrically conductive layer structure. For example, the stack may be a laminate of the mentioned electrically insulating layer structure(s) and electrically conductive layer structure (s), in particular formed by applying mechanical pressure, if desired supported by thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In the context of this document, the term "printed circuit board" (PCB) may particularly denote a component carrier which is formed by laminating several electrically conductive layer structures with at least one electrically insulating layer structure, for instance by applying pressure, if desired accompanied by the supply of thermal energy. A PCB may be plate-shaped (i.e. planar), three-dimensionally curved (for instance when manufactured using 3D printing) or may have any other shape. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with an electrically conductive material such as in particular copper, thereby forming vias as electric through-hole or blind-hole connections. Apart from one or more components which may be embedded (in addition to the already mentioned embedded component) a PCB is usually configured for accommodating one or more components on one or both opposing surfaces of the plate-shaped PCB. They may be connected to the respective main surface by soldering. A dielectric part of a PCB may be composed of resin with reinforcing fibers such as e.g. glass fibers.

In the context of this document, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example metallized vias. These lateral and/or vertical connections are arranged within the substrate and can be used to provide electrical and/or mechanical connections of housed components or unhoused components (such as bare dies), particularly of IC chips, with a PCB or intermediate PCB. Thus, the term "substrate" also includes "IC substrates". A dielectric part of a substrate may be composed of resin with reinforcing spheres (such as glass spheres).

The at least one electrically insulating layer structure may comprise at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene, a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

The at least one electrically conductive layer structure may comprise at least one of the group consisting of copper, aluminum, nickel, silver, gold, palladium, and tungsten. Although copper is usually preferred, other materials or coated versions thereof are possible as well, in particular coated with supra-conductive material such as graphene.

In the context of this document, the term "blind opening" may particularly denote any type of recess, cavity or hole that is formed from one surface side of the component carrier (portion) into the interior of the component carrier (portion) and that does not go through the entire component carrier (portion). However, a blind opening may also be realized first by forming a "through opening" which extends through the entire (thickness) extension of the component carrier (portion) and which is then closed at one surface of the component carrier (portion) by a cover such as a proper tape.

According to an embodiment of the invention the first component carrier portion comprises a lower electrically conductive layer structure. This lower electrically conductive layer structure may be used for forming electric conductor paths for electrically connecting the embedded component from the bottom. Thereby, the term "lower" may mean in particular that the lower electrically conductive layer structure is located within the first component carrier portion at a position which is opposite to the (upper) orifice or entrance of the blind opening. In other words, the lower electrically conductive layer structure forms at least a part of a base portion, in particular a base plate, for the blind opening. In some embodiments, the base portion may also comprises at least one electrically insulating layer such as a prepreg layer, a glue layer and/or a layer made from polyimide (PI) or liquid crystal polymer (LCP) or any other thermoplastic material (e.g. PEEK).

During manufacturing of a further processed respectively finished component carrier, which in addition to the two component carrier portions and the (embedded) component comprises further (laminated) component carrier portions, the described lower electrically conductive layer structure may be a bottom or lowermost electrically conductive layer structure.

According to a further embodiment of the invention the second component carrier portion comprises a gap filling material, in particular a flexible gap filling material, covering a sidewall of the blind opening, wherein the gap filling material is arranged between the sidewall and the component. This may provide the advantage that the component can be embedded within the blind opening in a mechanically safe and reliable manner. This holds in particular for applications, where a high flexibility of at least a part of the component carrier is given.

According to a further embodiment of the invention the second component carrier portion comprises a base layer, in particular a flexible base layer, covering a bottom of the blind opening. The component is mounted on this base layer.

The described base layer may be in particular an adhesive base layer such that a mounting of the component within the blind opening can be realized easily. Specifically, when placing the component onto the adhesive base layer an unintended movement of the placed component (before the second component carrier portion is formed) can be prevented. This may significantly facilitate a manufacturing of the described component carrier.

In accordance with the above mentioned sidewall coating also the provision of a base layer may improve the embedding of the component within the blind opening. Mechanical stress acting on the component can be reduced significantly in particular if at least a part of the component carrier exhibits a certain degree of flexibility.

According to a further embodiment of the invention the base layer comprises at least one contact opening for connecting the component from the bottom.

The contact opening may be a via which can be formed with known and well established procedures such as a mechanical drilling process or a laser drilling process. Of course, apart from cylindrical or conical geometries also any other geometry of a contact opening can be used.

The described contact opening within the base layer may provide the advantage that the embedded component is accessible not only from the top (as usual for an embedded component) but also from the bottom. This may contribute to a higher integration density because functional components being coupled with the component can be arranged not only at the top but also at the bottom of the described component carrier. Of course, if the component carrier is a so called multi-layer component carrier comprising further layers over and/or under the two component carrier portions the functional components may also be embedded within the multi-layer component carrier.

For coupling respectively connecting the embedded component with another functional component the at least one contact opening may be filled with a conductive material, in particular a metal such as copper. Further, the coupling may be used for electrically and/or thermally connecting the embedded component with such a functional component. In case a thermal coupling is desired the functional component may be for instance a heat sink, a heat pipe or any other element which is capable of disposing heat from the embedded component.

It is mentioned that depending on the specific application and in particular depending on the structure of the component it may also be possible to provide an electric and/or thermal contact to and/or for the component from the top side of the component. Such a top side contact may be formed in the same manner as the contact realized within the described contact opening at the bottom side of the component.

According to a further embodiment of the invention an upper surface of the component is (i) at least approximately at the same height level as an upper surface of the first component carrier portion, (ii) at a higher height level than an upper surface of the first component carrier portion, or (iii) at a lower height level than an upper surface of the first component carrier portion.

The described concept of embedding the component can be realized with different types of components, in particular with components having different heights. The same holds for the geometry respectively for the spatial dimensions of the component carrier and in particular of the first component carrier portion with its blind opening. It should be appreciated that this makes the described component carrier suitable for a plurality of different applications.

According to a further embodiment of the invention the second component carrier portion comprises a printed material, in particular a cured printed material.

Forming at least a part and preferably the entire second component carrier portion by means of a printing technology may provide the advantage that the second component carrier portion can be realized in an easy and effective manner. This holds in particular when the described component carrier is to be manufactured in a batch having a comparatively small number of component carriers and/or having differently dimensioned geometry or sizes.

For forming the second component carrier portion known and well established printing procedures such as screen printing, stencil printing, ink-jet printing, dispensing, etc. can be employed. The same holds for curing procedures for which e.g. thermal and/or radiative curing can be employed.

According to a further embodiment of the invention the second component carrier portion comprises two or more layer structures.

Realizing the second component carrier portion by means of a multi-layer structure may allow building up easily the second component carrier portion with desired mechanical properties and/or with a geometry (e.g. volume and/or shape) which may be properly adapted in size and/or in shape to the blind opening and/or the embedded component. This holds in particular for printed layer structures wherein the thickness of each individual layer can be adjusted properly.

For instance, in some embodiments the lateral size of the above mentioned base material is smaller than the lateral size of the blind opening. This may apply in particular if the smaller sized base material is sufficiently adhesive for ensuring that after placement of the component during further process steps the component will not unintentionally move or shift within the blind opening. Such embodiments may provide the advantage that when forming, in addition to the base layer, at least some other layers of the second component carrier portion a gap between the component and a sidewall of the blind opening may be filled with a uniform not-layered filling material.

According to a further embodiment of the invention the second component carrier portion comprises polyimide (PI) and/or Liquid Crystal Polymer (LCP). These materials may allow on the one hand (i) for a smooth and mechanically safe embedding of the component and on the other hand (ii) for a certain degree of mechanical flexibility which may be in particular of advantage in case the component carrier is an entirely flexible or a rigid-flex component carrier.

It is pointed out that also other flexible, bendable and/or stretchable materials can be used for the first component carrier portion. This holds both for the above mentioned base layer and for the above mentioned flexible gap filling material. It is preferable if the flexibility, bendability and/or stretchability is given also after a possible curing of the material. For instance, the beneficial flexibility, bendability and/or stretchability of a post-cured printed polyimide (PI) can be used to encapsulate a component in a flexible substrate maintaining the properties of standard PI. In case the (semiconductor) component itself is flexible, which might be the case if the component is very thin, e.g. thinner than 50 μm, then the entire component carrier representing a (semiconductor) package can be bent. Such a package might be highly suitable for wearable electronic applications, considering that three dimensional shapes and novel designs have to be fitted in order to guarantee a proper "wearability" of the electronic package.

According to a further embodiment of the invention the component carrier further comprises a third component carrier portion which is formed, in particular by means of a lamination procedure, onto the first component carrier portion and onto at least one of the component and the second component carrier portion.

The described third component carrier portion may contribute to an increased mechanical stability of the component carrier and in particular to a mechanically improved embedding of the component. The attachment of the third component carrier portion to the first component carrier portion and at least one of the component and the second component carrier portion may be preferably accomplished by means of known lamination procedures, which may be carried out with applying a pressure and/or heating up the entire component carrier structure which is to be laminated.

According to a further embodiment of the invention the component carrier further comprises a protective layer which is formed over or below the first component carrier portion and at least one of the component and the second component carrier portion.

The protective layer may make the described component carrier insensitive with regard to unwanted external influences such as mechanical stress, in particular punctual respectively spatial selective pressure, chemical substances, oxidizing substances, etc.

According to a further embodiment of the invention the component can be selected from a group consisting of an electrically non-conductive inlay, an electrically conductive inlay (such as a metal inlay, preferably comprising copper or aluminum), a heat transfer unit (for example a heat pipe), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

According to a further aspect of the invention there is provided a method of manufacturing a component carrier, in particular a component carrier as described above. The provided method comprises (a) providing a first component carrier portion having a blind opening; (b) arranging a component in the blind opening; and (c) forming a second component carrier portion by at least partially filling the blind opening with a material of the second component carrier portion. At least one of the first component carrier portion and the second component carrier portion comprises a flexible component carrier material. Further, the first component carrier portion and the second component carrier portion form a stack of a plurality of electrically insulating layer structures and/or electrically conductive layer structures.

Also the described method is based on the idea that embedding the component within a stack of several layer structures allows for many different configurations a component carrier with an embedded component. In particular, depending on the specific application the component carrier may be a pure flexible component carrier or a so called rigid-flexible or semi flexible component carrier having at least one rigid component carrier region and at least one flexible component carrier region.

According to an embodiment of the invention forming the second component carrier portion comprises (a) printing a precursor material of the second component carrier portion and (b) curing the precursor. The advantages of printing and curing have already been elucidated above.

It has to be noted that embodiments of the invention have been described with reference to different subject matters. In particular, some embodiments have been described with reference to apparatus type claims whereas other embodiments have been described with reference to method type claims. However, a person skilled in the art will gather from the above and the following description that, unless other notified, in addition to any combination of features belonging to one type of subject matter also any combination between features relating to different subject matters, in particular between features of the apparatus type claims and features of the method type claims is considered as to be disclosed with this document.

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

DETAILED DESCRIPTION OF ILLUSTRATED EMBODIMENTS

Figure 1A:
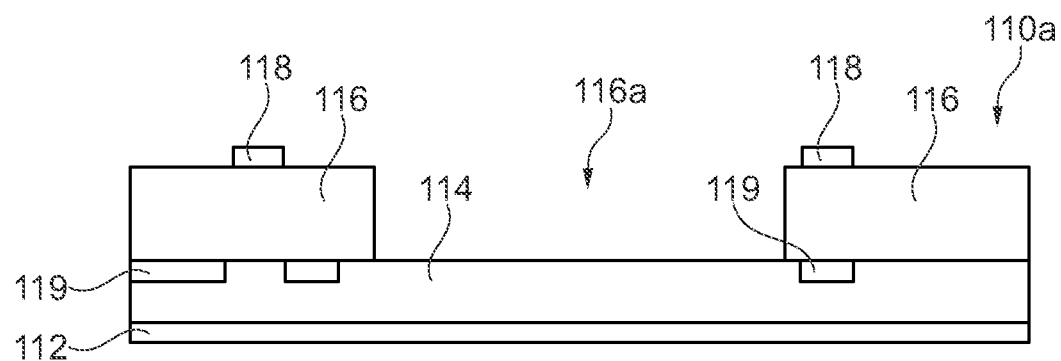
FIG. 1A shows a starting configuration for manufacturing a component carrier in accordance with an embodiment the invention.

The aspects defined above and further aspects of the invention are apparent from the examples of embodiment to be described hereinafter and are explained with reference to these examples of embodiment.

The illustrations in the drawings are schematically presented. It is noted that in different figures, similar or identical elements or features are provided with the same reference signs or with reference signs, which are different from the corresponding reference signs only within the first digit. In order to avoid unnecessary repetitions of elements or features which have already been elucidated with respect to a previously described embodiment are not elucidated again at a later position of the description.

Further, spatially relative terms, such as "front" and "back", "above" and "below", "left" and "right", et cetera are used to describe an element's relationship to another element(s) as illustrated in the figures. Thus, the spatially relative terms may apply to orientations in use which differ from the orientation depicted in the figures. Obviously all such spatially relative terms refer to the orientation shown in the figures only for ease of description and are not necessarily limiting as an apparatus according to an embodiment of the invention can assume orientations different than those illustrated in the figures when in use.

FIG. 1A shows a first component carrier portion 110a representing a starting configuration for manufacturing a component carrier in accordance with an embodiment the invention. The first component carrier portion 110a comprises an unstructured metal layer 112, an insulating layer 114 formed above the metal layer 112, and a further insulating layer 116 which is formed above the insulating layer 114 and which comprises a recess 116a. As will be described below, this recess represents a blind opening into which a component (not depicted in FIG. 1A) will be inserted. Further, according to the embodiment described here there are provided structured metal layers 118 and 119. As can be seen from FIG. 1A the metal layer 119 is embedded within the insulating layer 114 and the metal layer 118 is formed on top of the insulating layer 116. It is mentioned that in other embodiments additional insulating and/or conducting layer (structures) could be provided. In particular, the insulating layer 114 and/or the insulating layer 116 can be realized with a stack of at least two layers.

Figure 1B:
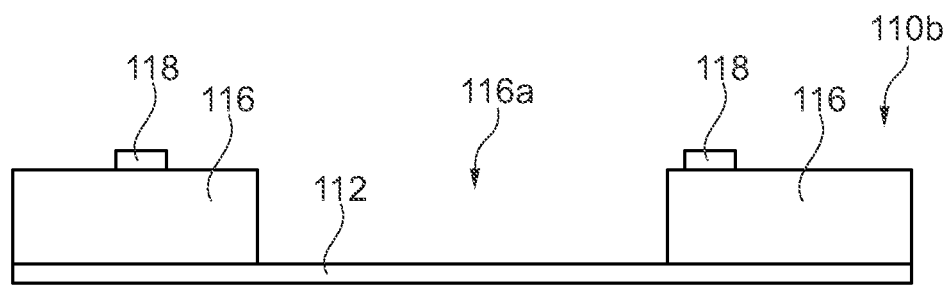
FIG. 1B shows another starting configuration for manufacturing a component carrier in accordance with another embodiment of the invention.

FIG. 1B shows a first component carrier portion 110b representing another starting configuration for manufacturing a component carrier in accordance with another embodiment of the invention. As can be seen, the first component carrier portion 110b differs from the first component carrier portion 110a shown in FIG. 1A in that the insulating layer 114 and the structured metal layer 119 are omitted. As a consequence, the unstructured metal layer 112 represents the bottom of the blind opening 116a.

It is pointed out that the first component carrier portion 110a/b with its blind opening 116a can be realized by means of known PCB technologies. Thereby, rigid and/or flex materials can be employed. Preferably, the bottom and/or the sidewalls of the blind opening 116a have at least a certain degree of flexibility such that the (not depicted) component can be embedded smoothly within the flex portion of the first component carrier portion 110a. In some embodiments the entire first component carrier portion 110a/b is made from flexible materials.

FIGS. 2A to 2F illustrate a process flow for embedding an electronic component 250 within a component carrier 200 which comprises the first component carrier portion 110a depicted in FIG. 1A.

Figure 2A:
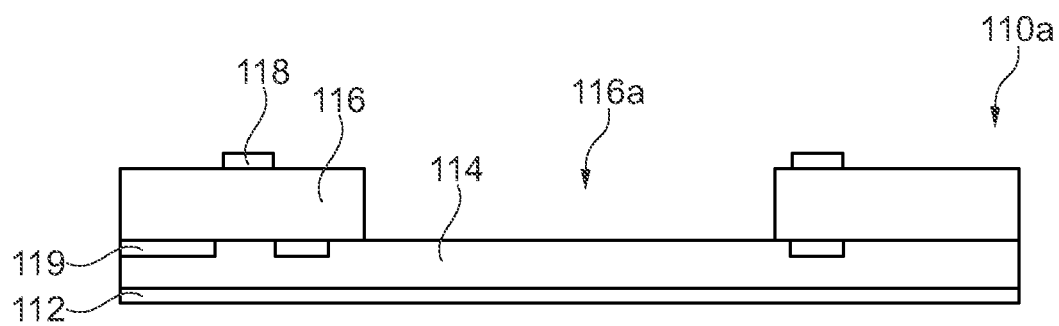
FIGS. 2A, 2B, 2C, 2D, 2E and 2F illustrate a process flow for embedding a component within a component carrier, wherein the component has an upper surface which is at a higher height level than an upper surface of the first component carrier portion.
Figure 2B:
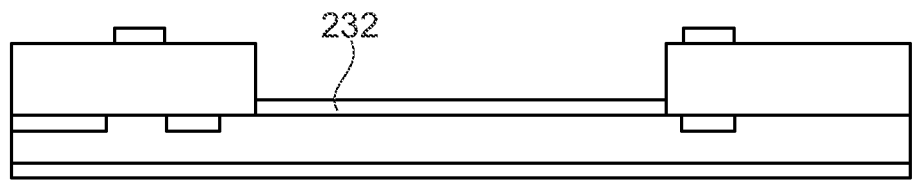

FIG. 2A shows the starting configuration which is also shown in FIG. 1A. For fixing the component 250 within the blind opening 116a a first a base layer 232 is formed at the bottom of the blind opening 116a. According to the exemplary embodiment described here the base layer comprises polyimide (PI). Here, the formation of the PI layer 232 is realized by a printing procedure. The resulting structure is illustrated in FIG. 2B.

Figure 2C:
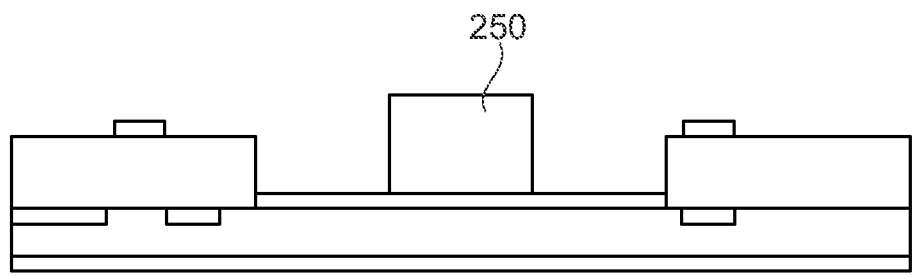
Figure 2D:
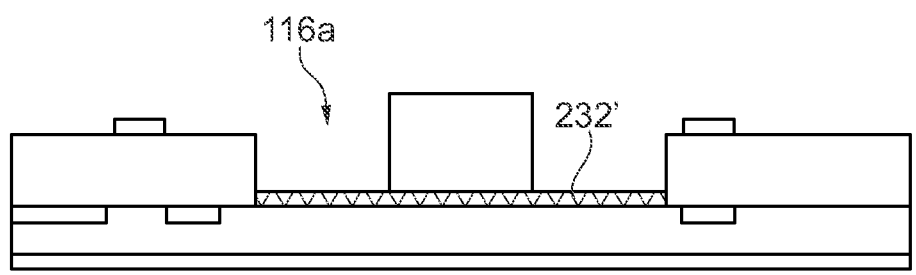

In a next step the component 250 is placed onto the PI layer 232. This is shown in FIG. 2C. Next, the PI material of the PI layer 232 is cured. This results in a cured base layer respectively cured PI layer 232' (see FIG. 2D).

Figure 2E:
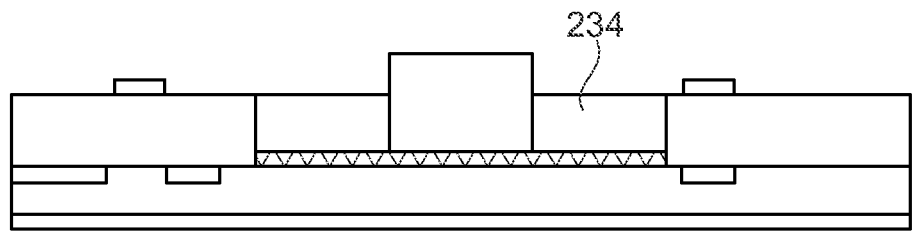

After curing the printed PI the component 250 will remain fixed in its position. Afterwards, subsequent filling material 234 is placed in the regions between the outer side surfaces of the component 250 and the inner sidewalls of the blind opening 116a. According to the exemplary embodiment described here also the filling material 234 is PI which is applied by means of a printing procedure. Thereby, depending e.g. on the desired thickness of the filling material 234 the printing can be realized with one or more printing steps. The resulting structure is illustrated in FIG. 2E.

Figure 2F:
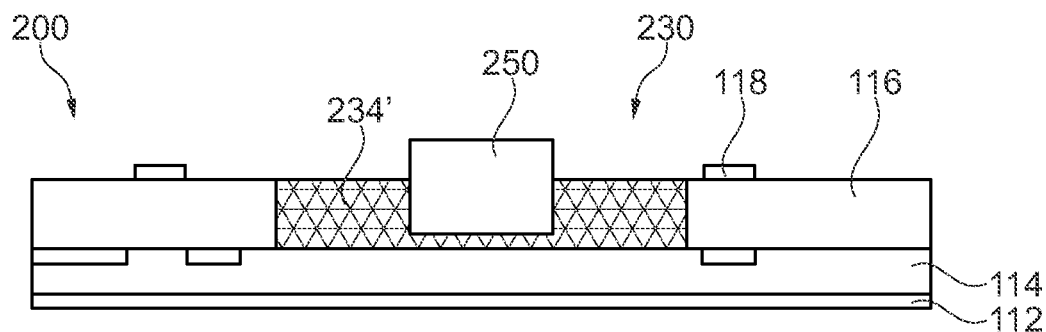

Next, the filling material 234 is cured which results in cured (printed) filling material 234' (see FIG. 2F). In the context of this document at least the cured base layer 232' and the cured filling material 234' represent a second component carrier portion 230. In the depicted embodiment the upper surface of the second component carrier portion 230 and the upper surface of the insulating layer 116 are located at the same height level.

It is mentioned that in case of a multi-layer filling material 234, 234' a curing can be performed step by step which means that after printing a layer this layer is cured before the next layer is printed thereon. It is further mentioned that a stepwise printing (and curing) can be continued until a desired height of the filling material 234' is achieved. Preferably, the height of the filling material 234' corresponds to the height of the first component carrier 110a respectively the height of the surface insulating layer 116.

As has already been mentioned above a screen printing, a stencil printing, an ink-jet printing, dispensing, etc. can be used as appropriate printing technology for forming the base layer 232 and/or the filling material 234.

As can be seen best from FIG. 2F the component 250 has a height respectively a thickness which is larger than the depth of the blind opening 116a. As a consequence, the upper surface of the component 250 is at a height level which is higher than the upper surface of the insulating layer 116. The difference between the height levels of the upper surfaces of the component 250 and the insulating layer 116 of course also depends on the thickness of the base layer 232.

Figure 3:
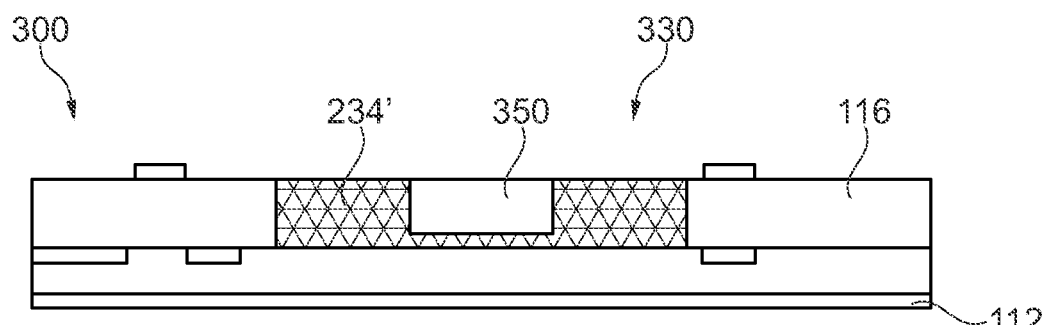
FIG. 3 shows a component carrier with an embedded component having an upper surface which is at the same height level as an upper surface of the first component carrier portion.
Figure 4:
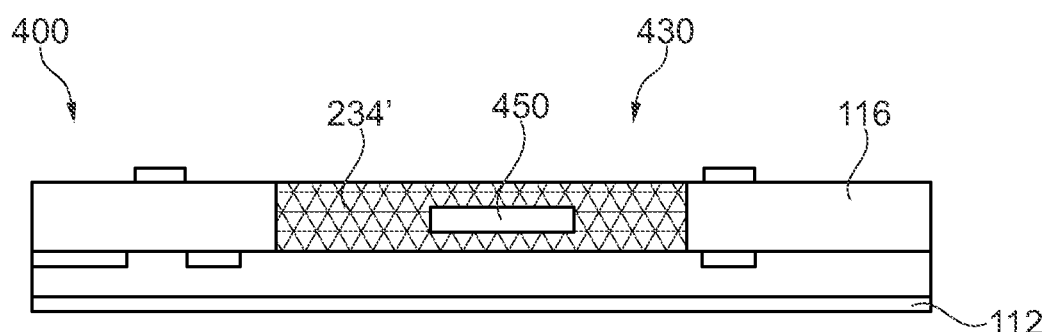
FIG. 4 shows a component carrier with an embedded component having an upper surface which is at a lower height level than an upper surface of the first component carrier portion.

With regard to the height respectively the thickness of the component 250 and the thickness of the base layer 232' FIG. 3 and FIG. 4 show different embodiments.

FIG. 3 shows a component carrier 300 with an embedded component 350 having an upper surface which is at the same height level as an upper surface of the insulating layer 116 of the first component carrier portion. Again, the upper surface of the second component carrier portion 330 and the upper surface of the insulating layer 116 are at the same height level.

FIG. 4 shows a component carrier 400 with an embedded component 450 having an upper surface which is at a lower height level than an upper surface of the insulating layer 116 of the first component carrier portion. In this embodiment an upper portion of the second component carrier portion 430, which portion forms a part of the printed and cured filling material 234', covers the upper surface of the (completely) embedded electronic component 450.

Once that the component 250, 350, 450 is at least partially embedded within the second component carrier portion 230, 330, 430 a further build-up process for all three possibilities shown in FIGS. 2F, 3, and 4 can be executed.

FIGS. 5A to 5D illustrate such a build-up process for a laminated component carrier on the basis of the component carrier 200 wherein the upper surface of the (partially) embedded component 250 is above the upper surface of the insulating layer 116. As can be seen from FIG. 5A, according to the exemplary embodiment described here a third component carrier portion 560 is laminated on top of the component carrier 200. In this embodiment the third component carrier portion 560 comprises two insulating layer structures, an insulating layer structure 562 and a further insulating layer structure 564, and one metal layer structure 566 formed on top of the further insulating layer structure 564. The insulating layer structure 562 comprises a recess 562*a* which, with regard to its lateral position and its height, is aligned with the (upper portion of the) electronic component 250.

It is mentioned that in other embodiments the third component carrier portion comprises a smaller number of insulating layer structures, e.g. only one insulating layer structure and one metal layer structure or only one insulating layer structure. In yet other embodiments the third component carrier portion comprises a larger number of layer structures (insulating layer structures and/or metal layer structures).

Figure 5A:
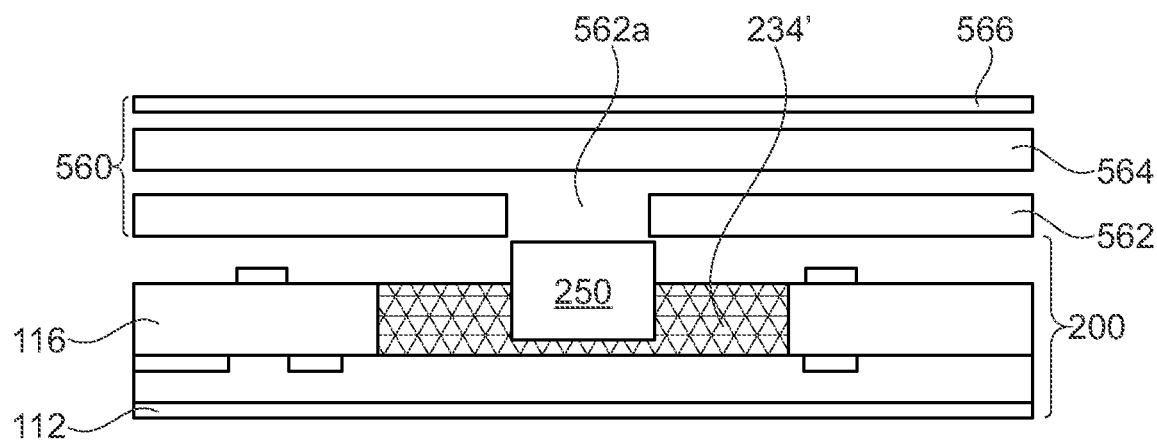
FIGS. 5A, 5B, 5C and 5D illustrate a build-up process for a laminated component carrier with a subsequent contacting of the embedded component of the component carrier depicted in FIG. 2F.
Figure 5B:
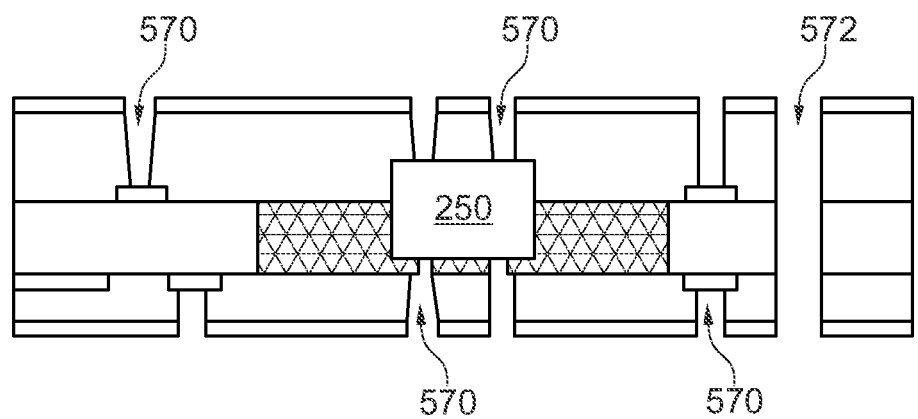

After laminating the component carrier 200 (including the first component carrier portion and the second component carrier portion) with the third component carrier portion 560 laser and/or mechanical vias are formed. The resulting structure is shown in FIG. 5B. According to the embodiment described here the vias include blind vias 570 and one through hole via 572. It should be considered that, in order to achieve the highest bendability performances (highest reliability) the via size should be as small as possible. Appropriate via sizes or diameters may be preferably smaller than 100 μm.

Figure 5C:
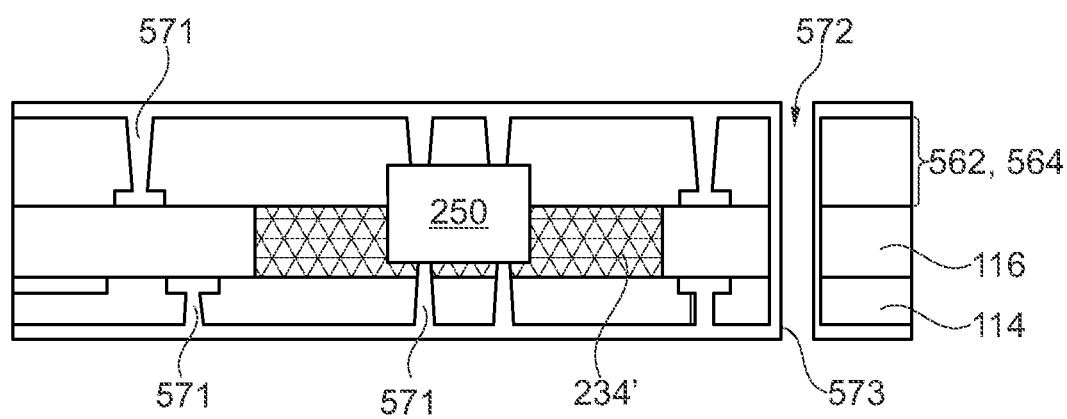

In a next process step illustrated in FIG. 5C the vias 570 and 572 are metallized in order to provide for appropriate vertical electric connections within the entire package. According to the exemplary embodiment described here the metallization of the blind vias is a full metallization which is denominated with reference numerals 571. The metallization of the through hole via 572 is an inner sidewall metallization which is denominated with reference numeral 573. As can be seen from FIG. 5C, two blind vias contact the electronic component 250 from the bottom and two further blind vias contact the electronic component 250 from the top.

Figure 5D:
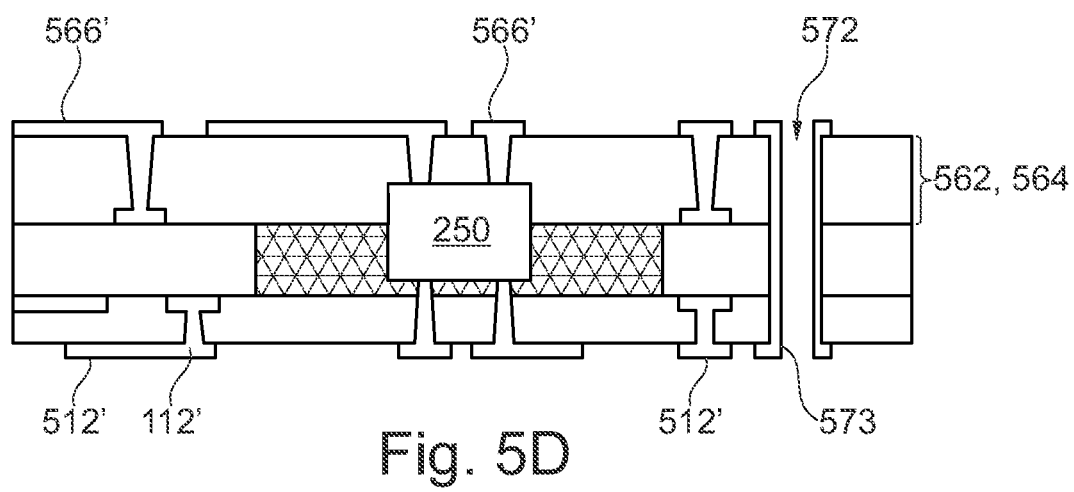

In a further process step illustrated in FIG. 5D the upper metal layer structure 566 is structured such that a structured metal layer 566' is formed. Accordingly, the lower metal layer 112 is structured such that a structured metal layer 512' is formed.

Figure 6:
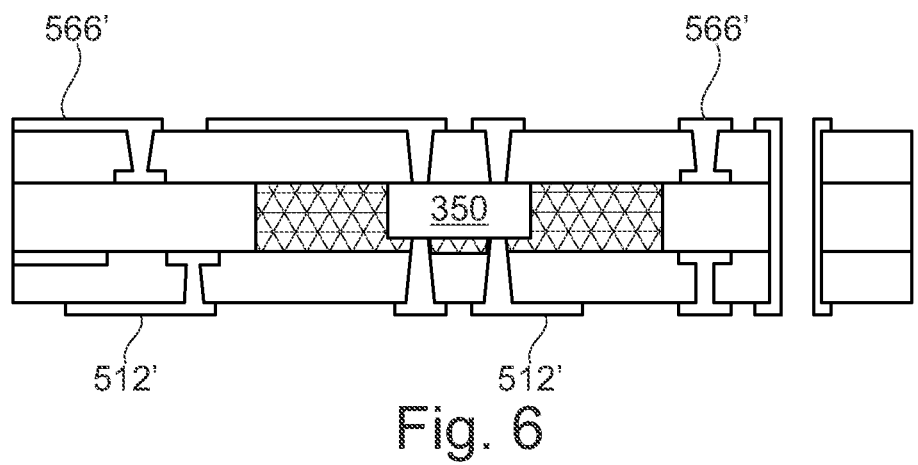
FIG. 6 shows a laminated component carrier wherein the component of the component carrier depicted in FIG. 3 is contacted.

FIG. 6 shows a laminated component carrier wherein the electronic component 350 of the component carrier 300 depicted in FIG. 3 is electrically contacted by means of appropriate via connections.

Figure 7:
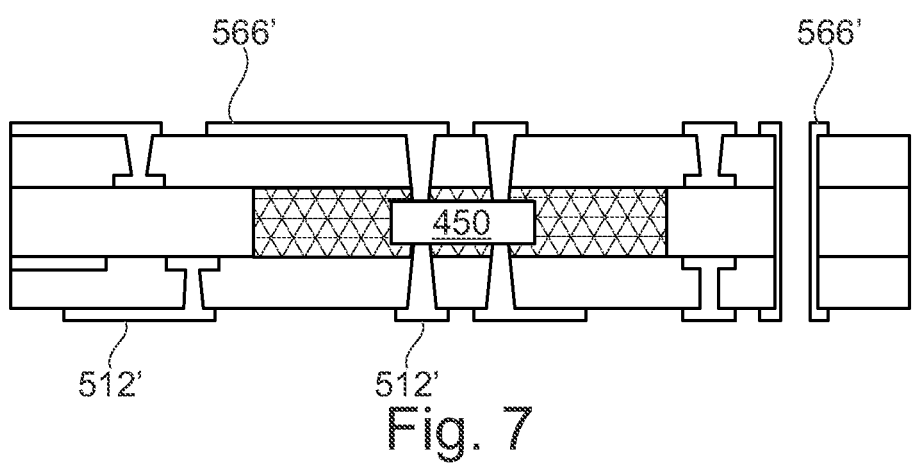
FIG. 7 shows a laminated component carrier wherein the component of the component carrier depicted in FIG. 4 is contacted.

FIG. 7 shows a laminated component carrier wherein the electronic component 450 of the component carrier 400 depicted in FIG. 4 is electrically contacted.

Figure 8A:
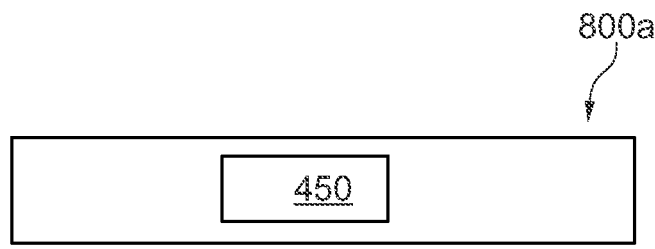
FIGS. 8A, 8B, and 8C show schematic illustrations of a full rigid, a rigid-flex and a full flex component carrier, respectively.
Figure 8B:
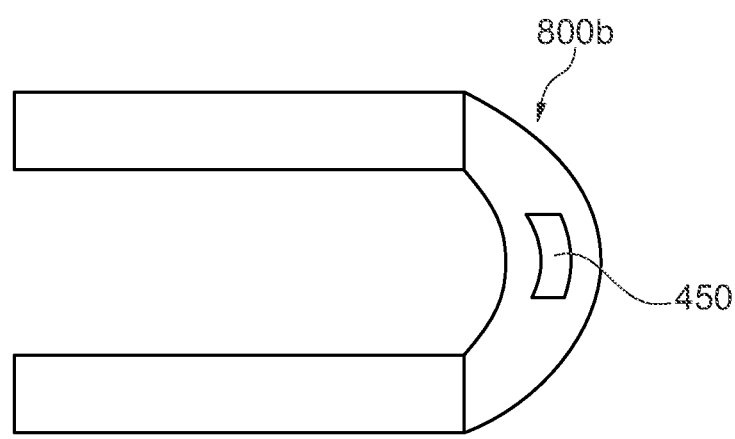
Figure 8C:
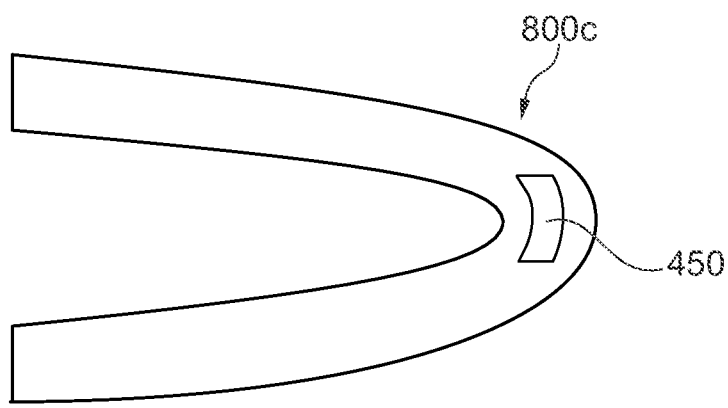

FIGS. 8A, 8B, and 8C show schematic illustrations of products resulting from embodiments of a lamination and contacting process comparable to the procedure illustrated in FIGS. 5A to 5D. Specifically, FIG. 8A shows a full rigid component carrier 800*a*, FIG. 8B shows a rigid-flex component carrier 800*b*, and FIG. 8C shows full flex component carrier 800*c*. It is mentioned that a full rigid component carrier 800*a* can also result from a component carrier which comprises at least one component carrier portion with a certain amount of non-rigid or flex materials. For yielding a full rigid construction it is sufficient that other rigid portions ensure that there is no or at least no significant flexibility or bendability. Using a flexible component carrier material may also be of advantage for a full rigid component carrier construction for instance in order to ensure that a component will be embedded in a mechanical smooth manner.

FIGS. 9A to 9D illustrate a process for contacting an embedded component 450 at its bottom side. The process starts with the component carrier 400 as depicted in FIG. 4.

Figure 9A:
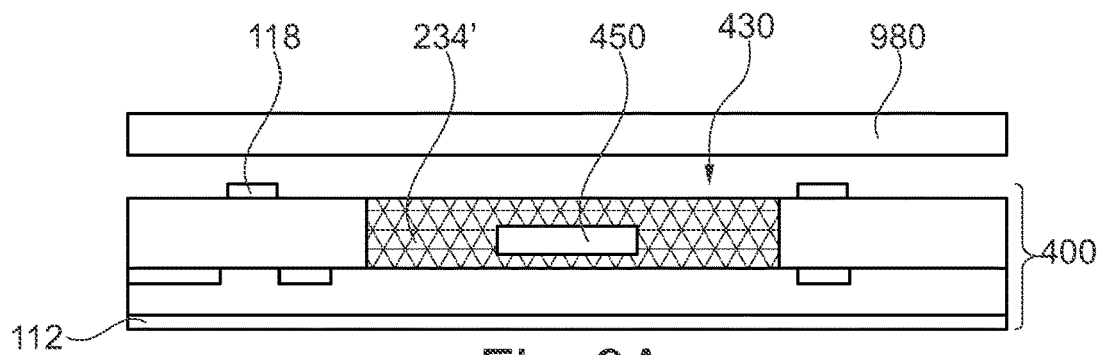
FIGS. 9A, 9B, 9C and 9D illustrate a process for contacting an embedded component at its bottom side.

As can be from FIG. 9A, in a first step a protection layer 980 is provided and formed over the component carrier 400. Preferably, the protection layer 980 is laminated directly on the upper surface of the component carrier 400 (see FIG. 9B). Alternatively there may be one or more not depicted intermediate layers.

Figure 9B:
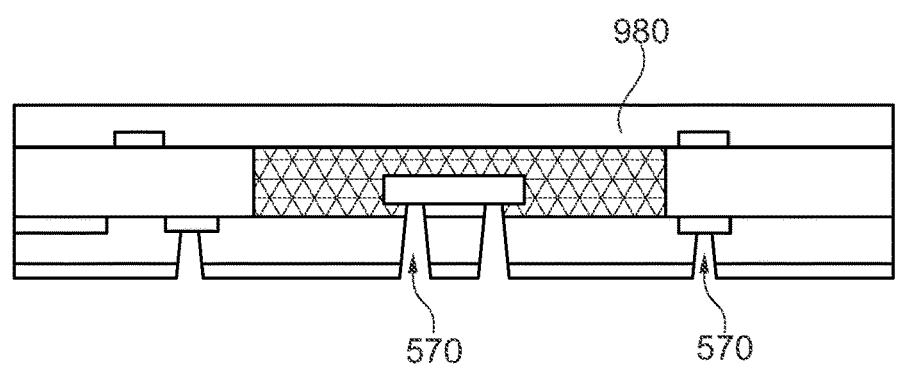
Figure 9C:
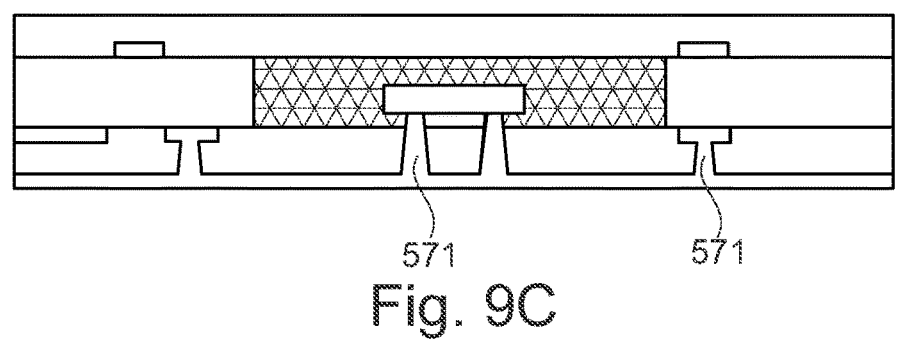

In a next step appropriate vias 570 are formed by laser or mechanical drilling. The resulting structure is shown in FIG. 9B. Next, as can be seen from FIG. 9C, the vias 570 are metallized in order to form vertical electric connections 571.

Figure 9D:
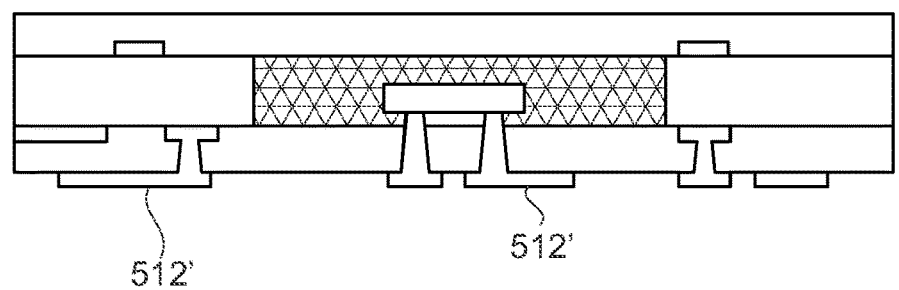

Finally, the lower metal layer 112 is structured resulting in a structured metal layer 512' as depicted in FIG. 9D.

Embodiments of the invention, fields of application and advantages of embodiments of the invention can be descriptively summarized as follows.

Electronic components can be embedded in flexible component carriers by using PI in order to both (i) fix the component within a blind opening and (ii) guarantee a mechanical flexibility. Flexible component carriers are highly desired for wearable applications and devices where special design and appearance must be followed.

Embodiments of the invention can be employed for medical applications. For instance very thin (electronic) components, e.g. with a thickness less than 50 μm, in combination with a thin flexible package can be used for "skin" electronics, i.e. electronics applied directly on the surface of the human or animal body.

The use of a flexible adhesive such as PI may guarantee a good bendability of the embedded component. Further, PI printed in the blind opening for fixing the component allows for a high elongation which is in particular beneficial to reduce mechanical stress acting on the embedded component during a bending and/or stretching of the entire component carrier/package.

A further advantage of using PI is given by its high break down voltage compared to conventional prepreg materials used of PCBs. Since PI is a comparatively expensive material it might be possible to print it in such a spatial manner that it encapsulates solely the component (to be embedded), thereby protecting the surrounding component carrier materials.

It should be noted that the term "comprising" does not exclude other elements or steps and the use of articles "a" or "an" does not exclude a plurality. Also elements described in association with different embodiments may be combined.

LIST OF REFERENCE SIGNS

110*a/b* first component carrier portion
112 metal layer (unstructured)
114 insulating layer
116 insulating layer
116*a* blind opening
118 metal layer (structured)
119 metal layer (structured)
200 component carrier
230 second component carrier portion
232 base layer
232' cured base layer
234 (printed) filling material/gap filling material 234' cured (printed) filling material/cured gap filling material
250 (electronic) component
300 component carrier
330 second component carrier portion
350 (electronic) component
400 component carrier
430 second component carrier portion
450 (electronic) component
512' metal layer (structured)
560 third component carrier portion
562 insulating layer structure
562a recess
564 further insulating layer structure
566 metal layer structure
566' structured metal layer
570 blind hole/blind via
571 metallization/vertical electric via connection
572 through hole/through via
573 metallization
800a full rigid component carrier
800b rigid-flex component carrier
800c full-flex component carrier
980 protection layer/protective layer

The invention claimed is:

1. A component carrier being a printed circuit board or an integrated circuit substrate, comprising:
a first component carrier portion having a blind opening;
a component arranged in the blind opening; and
a second component carrier portion at least partially filling the blind opening;
wherein the second component carrier portion comprises a flexible component carrier material,
wherein the second component carrier portion comprises a gap filling material covering a sidewall of the blind opening,
wherein the gap filling material is arranged between the sidewall and the component,
wherein the second component carrier portion comprises a base layer covering a bottom of the blind opening,
wherein the component is mounted on the base layer,
wherein the base layer and the gap filling material are the same material,
wherein the first component carrier portion forms a stack of a plurality of electrically insulating layer structures and/or electrically conductive layer structures,
wherein the component carrier comprises in a direction of main extension two rigid component carrier regions connected via a flexible component carrier region, so that the two rigid component carrier regions are flexibly bendable towards each other,
wherein the two rigid component carrier regions comprise the first component carrier portion,
wherein the flexible component carrier region comprises the second component carrier portion, and
wherein the component is flexible, so that the component is bent, when the two rigid component carrier regions are flexibly bent towards each other.

2. The component carrier of claim 1, wherein the first component carrier portion comprises a lower electrically conductive layer structure.

3. The component carrier as set forth in claim 1, wherein the base layer comprises at least one contact opening for connecting the component from the bottom.

4. The component carrier as set forth in claim 1, wherein an upper surface of the component is
  i) at least approximately at the same height level as an upper surface of the first component carrier portion,
  ii) at a higher height level than an upper surface of the first component carrier portion, or
  iii) at a lower height level than an upper surface of the first component carrier portion.

5. The component carrier as set forth in claim 1, wherein the gap filling material is a printed material.

6. The component carrier as set forth in claim 1, wherein the second component carrier portion comprises two or more layer structures.

7. The component carrier as set forth in claim 1, further comprising:
a third component carrier portion which is formed onto the first component carrier portion and onto at least one of the component and the second component carrier portion.

8. The component carrier as set forth in claim 1, further comprising:
a protective layer which is formed over or below the first component carrier portion and at least one of the component and the second component carrier portion.

9. The component carrier as set forth in claim 1, wherein the component is selected from a group consisting of an electronic component, an electrically non-conductive and/or electrically conductive inlay, a heat transfer unit, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier and a logic chip.

10. The component carrier as set forth in claim 1,
wherein the gap filling material is a cured material, and
wherein the gap filling material comprises polyimide and/or a liquid crystal polymer.

11. A method of manufacturing a component carrier being a printed circuit board or an integrated circuit substrate, the method comprising:
providing a first component carrier portion having a blind opening;
arranging a component in the blind opening; and
forming a second component carrier portion by at least partially filling the blind opening with a material of the second component carrier portion;
wherein the second component carrier portion comprises a flexible component carrier material,
wherein the second component carrier portion comprises a gap filling material covering a sidewall of the blind opening,
wherein the gap filling material is arranged between the sidewall and the component,
wherein the second component carrier portion comprises a base layer covering a bottom of the blind opening,
wherein the component is mounted on the base layer;
wherein the base layer and the gap filling material are the same material,
wherein the first component carrier portion forms a stack of a plurality of electrically insulating layer structures and/or electrically conductive layer structures,
wherein the component carrier comprises in a direction of main extension two rigid component carrier regions connected via a flexible component carrier region, so that the two rigid component carrier regions are flexibly bendable towards each other, wherein the two rigid component carrier regions comprise the first component carrier portion, wherein the flexible component carrier region comprises the second component carrier portion; and wherein the component is flexible, so that the component is bent, when the two rigid component carrier regions are flexibly bent towards each other.

12. The method as set forth in claim 11,
wherein the gap filling material is a cured material, and
wherein the gap filling material comprises polyimide and/or a liquid crystal polymer.

13. A component carrier being a printed circuit board or an integrated circuit substrate, comprising:
a first component carrier portion having a blind opening;
a component arranged in the blind opening; and
a second component carrier portion at least partially filling the blind opening;
wherein the second component carrier portion comprises a flexible component carrier material,
wherein the second component carrier portion comprises a gap filling material covering a sidewall of the blind opening,
wherein the gap filling material is arranged between the sidewall and the component,
wherein the gap filling material is a cured material,
wherein the gap filling material comprises polyimide and/or a liquid crystal polymer,
wherein the second component carrier portion comprises a base layer covering a bottom of the blind opening,
wherein the component is mounted on the base layer,
wherein the base layer and the gap filling material are the same material, wherein the first component carrier portion forms a stack of a plurality of electrically insulating layer structures and/or electrically conductive layer structures,
wherein the component carrier comprises in a direction of main extension two rigid component carrier regions connected via a flexible component, carrier region, so that the two rigid component carrier regions are flexibly bendable towards each other,
wherein the two rigid component carrier regions comprise the first component carrier portion,
wherein the flexible component carrier region comprises the second component carrier portion, and
wherein the component is flexible, so that the component is bent, when the two rigid component carrier regions are flexibly bent towards each other.

* * * * *